(12) United States Patent
Su

(10) Patent No.: US 12,191,214 B2
(45) Date of Patent: Jan. 7, 2025

(54) SYSTEM AND METHODS FOR CONTROLLING AN AMOUNT OF PRIMER IN A PRIMER APPLICATION GAS

(71) Applicant: Taiwan Semiconductor Manufacturing Company Limited, Hsinchu (TW)

(72) Inventor: Pei-Yi Su, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 617 days.

(21) Appl. No.: 17/469,191

(22) Filed: Sep. 8, 2021

(65) Prior Publication Data

US 2022/0285230 A1 Sep. 8, 2022

Related U.S. Application Data

(60) Provisional application No. 63/157,049, filed on Mar. 5, 2021.

(51) Int. Cl.
*H01L 21/66* (2006.01)
*H01L 21/67* (2006.01)

(52) U.S. Cl.
CPC ........ *H01L 22/20* (2013.01); *H01L 21/67253* (2013.01)

(58) Field of Classification Search
USPC ........................................ 118/688
See application file for complete search history.

(56) References Cited

U.S. PATENT DOCUMENTS

| | | | | |
|---|---|---|---|---|
| 3,589,868 A | * | 6/1971 | Hozumi | G01N 31/00 436/124 |
| 4,075,834 A | * | 2/1978 | Saito | F01N 3/22 60/276 |
| 4,094,187 A | * | 6/1978 | Navarre, Jr. | G01N 33/0006 73/864.34 |
| 4,299,036 A | * | 11/1981 | Schregenberger | F27B 9/40 34/216 |
| 4,336,590 A | * | 6/1982 | Jacq | B64D 10/00 128/204.22 |
| 5,100,495 A | * | 3/1992 | Ohmi | H01L 21/31116 257/E21.252 |
| 5,220,517 A | * | 6/1993 | Sierk | F17C 13/04 700/282 |
| 5,329,463 A | * | 7/1994 | Sierk | F17C 13/02 340/606 |
| 5,497,316 A | * | 3/1996 | Sierk | F17C 13/02 700/282 |
| 5,508,947 A | * | 4/1996 | Sierk | H01L 21/67276 702/87 |

(Continued)

*Primary Examiner* — Jethro M. Pence
(74) *Attorney, Agent, or Firm* — The Marbury Law Group, PLLC

(57) ABSTRACT

A system for controlling an amount of primer in a primer application gas, includes a first sensor for detecting a first content in the primer application gas that is fed into a chamber containing a semiconductor wafer, a second sensor for detecting a second content in an exhaust gas that is exhausted from the chamber, and a flow control device that controls the amount of primer in the primer application gas based on a first sensor signal from the first sensor and a second sensor signal from the second sensor.

20 Claims, 5 Drawing Sheets

(56) References Cited

U.S. PATENT DOCUMENTS

| | | | | |
|---|---|---|---|---|
| 5,546,788 A * | 8/1996 | Dickow | ............ | G01M 15/102 73/28.01 |
| 5,627,328 A * | 5/1997 | Sheridan | ............ | G01N 33/0031 73/863.83 |
| 5,810,928 A * | 9/1998 | Harada | ............ | C23C 16/52 118/712 |
| 6,165,347 A * | 12/2000 | Warburton | ............ | G01N 33/0022 205/781 |
| 6,172,759 B1 * | 1/2001 | Goldstein | ............ | G01N 21/3504 436/164 |
| 6,442,736 B1 * | 8/2002 | Girard | ............ | C30B 33/005 716/54 |
| 6,721,032 B2 * | 4/2004 | Hasegawa | ............ | G03F 7/70558 355/53 |
| 6,782,907 B2 * | 8/2004 | Kawasaki | ............ | C23C 16/4412 137/12 |
| 7,137,400 B2 * | 11/2006 | Bevers | ............ | G05D 7/0658 73/1.16 |
| 7,604,010 B2 * | 10/2009 | Hasebe | ............ | C23C 16/4412 216/60 |
| 8,024,108 B2 * | 9/2011 | Hacker | ............ | F01N 3/225 73/114.71 |
| 8,414,748 B2 * | 4/2013 | Carson | ............ | A61L 11/00 204/252 |
| 8,528,424 B2 * | 9/2013 | Otsuki | ............ | G01N 33/0026 73/863.03 |
| 8,762,075 B2 * | 6/2014 | Loui | ............ | G01N 29/036 702/24 |
| 8,949,001 B2 * | 2/2015 | Suzuki | ............ | F02D 41/1498 123/691 |
| 9,012,331 B2 * | 4/2015 | Moriya | ............ | H01L 21/67207 216/79 |
| 9,422,877 B2 * | 8/2016 | Sorge | ............ | F02D 41/0072 |
| 9,644,796 B2 * | 5/2017 | Mohammed | ............ | G05D 7/0635 |
| 9,772,629 B2 * | 9/2017 | Mohammed | ............ | G01F 25/15 |
| 9,857,028 B2 * | 1/2018 | Carlson | ............ | C23C 16/52 |
| 9,869,663 B2 * | 1/2018 | Tsuzuki | ............ | G01N 33/0006 |
| 9,934,956 B2 * | 4/2018 | Drewery | ............ | H01L 21/67 |
| 9,951,422 B2 * | 4/2018 | Shin | ............ | C23C 16/458 |
| 10,222,810 B2 * | 3/2019 | Mohammed | ............ | G05D 7/0623 |
| 10,385,457 B2 * | 8/2019 | Yagi | ............ | C23C 16/52 |
| 10,590,532 B2 * | 3/2020 | Fukumaki | ............ | G05D 7/0635 |
| 10,591,934 B2 * | 3/2020 | Gopalakrishnan | ............ | H01L 21/67253 |
| 10,720,341 B2 * | 7/2020 | Liang | ............ | C23C 16/4412 |
| 11,231,403 B2 * | 1/2022 | Bertini | ............ | G01N 33/0067 |
| 11,536,494 B1 * | 12/2022 | Davis | ............ | F25B 7/00 |
| 11,967,534 B2 * | 4/2024 | Kamakura | ............ | C23C 16/52 |
| 2004/0007186 A1 * | 1/2004 | Saito | ............ | G05D 16/2013 118/724 |
| 2005/0070034 A1 * | 3/2005 | Gibson, Jr. | ............ | H01L 21/67 257/E21.616 |
| 2008/0047581 A1 * | 2/2008 | Miyazaki | ............ | C23C 16/4405 134/56 R |
| 2010/0252451 A1 * | 10/2010 | Warburton | ............ | G01N 27/404 205/785.5 |
| 2011/0035957 A1 * | 2/2011 | Muraki | ............ | H01L 21/67748 34/236 |
| 2012/0058013 A1 * | 3/2012 | Swanson | ............ | B01D 53/8696 60/39.5 |
| 2018/0251894 A1 * | 9/2018 | Yamaguchi | ............ | H01L 21/28568 |
| 2020/0098606 A1 * | 3/2020 | Ishibashi | ............ | H01L 21/6773 |
| 2020/0347498 A1 * | 11/2020 | Inada | ............ | H01L 21/02164 |
| 2020/0399759 A1 * | 12/2020 | Yamazaki | ............ | C23C 16/4412 |
| 2023/0028662 A1 * | 1/2023 | Zhang | ............ | G05D 7/0635 |
| 2024/0068093 A1 * | 2/2024 | Downey | ............ | C23C 16/4412 |

\* cited by examiner

SYSTEM AND METHODS FOR CONTROLLING AN AMOUNT OF PRIMER IN A PRIMER APPLICATION GAS

RELATED APPLICATIONS

This application claims the benefit of priority from a U.S. provisional application Ser. No. 63/157,049, entitled "HDMS Auto Feedback System", filed on Mar. 5, 2021, the entire contents of which are incorporated herein by reference.

BACKGROUND

In the manufacture of semiconductor devices, photolithography is used to transfer the image of a pattern, such as a circuit pattern, to a device formed on a wafer. Typically, a photolithography process entails depositing a photoresist over the device, aligning a mask bearing the pattern over the photoresist, exposing a light source, such as ultraviolet light, through or reflected by the mask and onto the layer of photoresist, and developing the exposed layer of photoresist to remove select (exposed or non-exposed) portions of the photoresist, thereby patterning the layer of photoresist.

The photolithography process may additionally include depositing a primer (e.g., hexamethyldisilazane (HMDS)) and one or more baking processes. The primer deposition process may be performed to improve the adhesion of the photoresist to the device (or intermediate layers of a device). A baking process may be performed to remove moisture or an organic solvent from the device before the photoresist is deposited over the device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
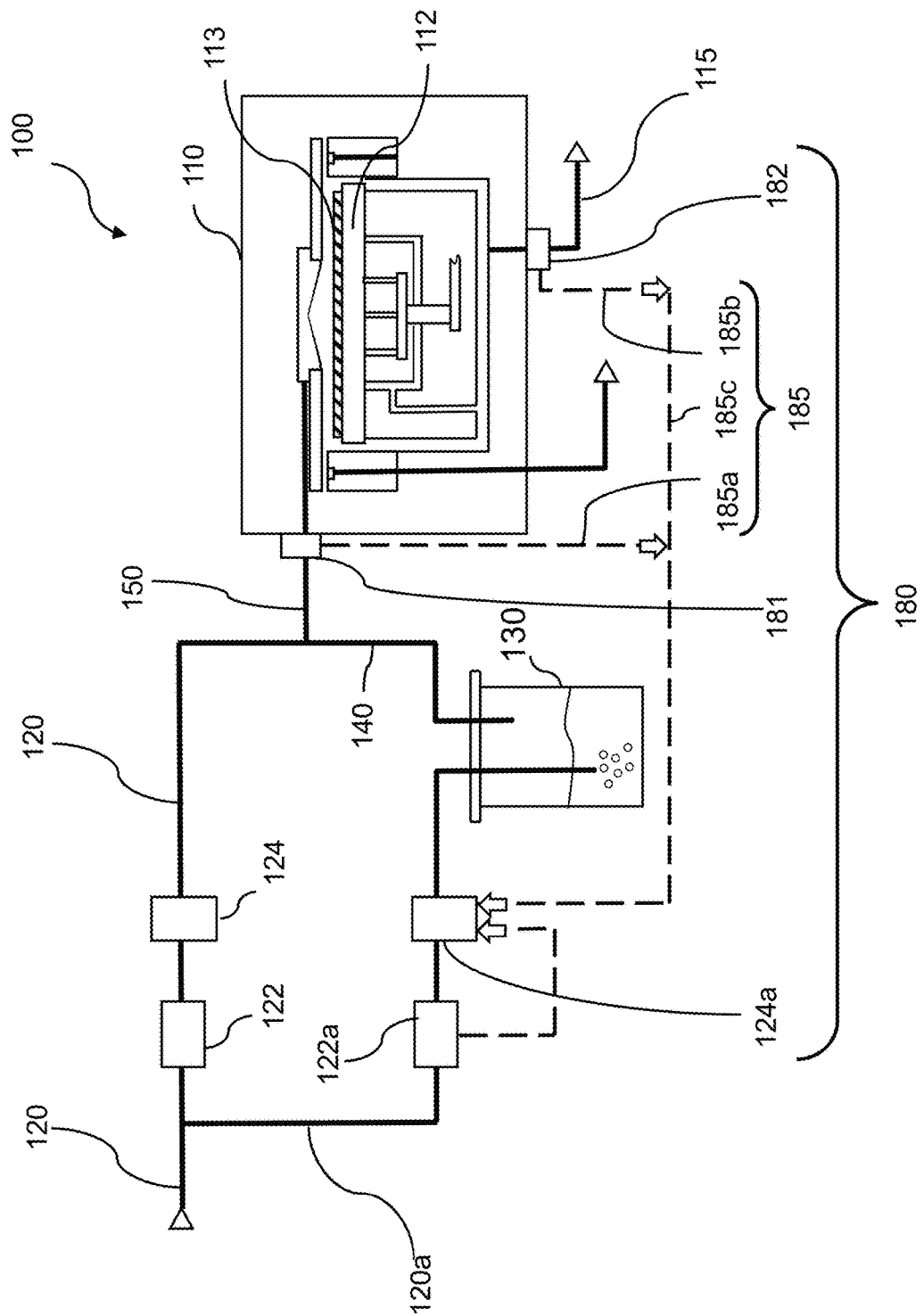
FIG. 1 illustrates an apparatus 100 for processing a semiconductor wafer in accordance with various embodiments.

The following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor manufacturing, a device surface (including intermediate device surfaces during fabrication) may be "primed" before the device surface is coated with photoresist. The primer or priming is a pre-resist coating of some material that may increase the adhesion of the photoresist to the device surface. The primer may reduce the amount of lateral etching or undercutting that may occur during the fabrication process. The adhesion of photoresist to wafer and mask surfaces is a function of the amount of inter-molecular bonding between the photoresist and the surface onto which it is applied.

In addition to this fundamental adhesive force, which is chemical in nature (molecular and atomic bombing), there may be "external" forces and factors that influence the ability of a photoresist layer to withstand lateral etching. These factors include: the moisture content of the device surface, the wetting characteristics of the photoresist on the device surface, the type of primer used, the method of application of the primer, the photoresist chemistry, the contamination or surface defects that occur at the interface of the photoresist and device surface.

Adhesion of photoresist to the device surface is reduced when the photoresist is applied over a hydrated device surface. The presence of water on the device surface may allow etchants, and in particular wet etchants, to penetrate easily between the photoresist and the device surface. The penetrating etchants may etch the oxides located under the photoresist making the oxide pattern smaller thus causing an "undercutting" problem. The smaller, less accurate oxide patterns may cause ultimate device failures and change the parameters of the subsequently fabricated devices.

To remove moisture from the device surface/photoresist interface, a primer may applied to the device surface prior to the formation of a photoresist layer thereover. The primer may react with any present moisture to "tie up" the moisture such that photoresist adhesion may be increased. For example, primers such as hexamethyldisilizane (HMDS) may be used to react with device-oxide surfaces so as to tie up molecular water. However, an accumulation (or liquid droplets) of primer on the device surface before the photoresist is applied may also affect the photoresist coverage and cause defects in the photoresist pattern which is subsequently formed.

Many conventional solutions have been used to promote the adhesion of photoresists to wafer and other semiconductor surfaces. Adhesion promoters such as hexamethyldisilizane (HMDS), Trichlorophenylsilane (TCPS), bistrimethylsilylacetimide (BSA), and Xylene may be used, for example, on semiconductor, oxide (e.g., silicon dioxide), metal, and glass surfaces. Of these adhesion promoters, HMDS may be the most commonly used.

The application of adhesion promoters to device surfaces can be performed by one of three formation techniques: (1) wafer spin coating, (2) dip coating, or (3) vapor coating. Vapor priming is the use of primer vapors to provide conversion of surface contaminants such as silicon dioxide. Vapor priming has an advantage of reducing contamination by solid particles since only vapors touch the wafer. A typical vapor priming system consists of a primer source, a wafer priming chamber and piping connecting a bubbler to the wafer priming chamber. In operation, HMDS vapor and nitrogen flow from a source through the piping to the wafer priming chamber where the HDMS vapor and nitrogen flows across the wafers. In this manner, the wafers may be coated with a layer of HMDS primer.

An embodiment of the present invention includes an HMDS automatic feedback system that may be used, for example, in a method of applying a primer to a semiconductor wafer (e.g., priming the wafer) in a semiconductor photolithography process. In some instances, various methods of applying primer (e.g., HMDS) may set a flow rate (e.g., a constant flow rate) of carrier gas (e.g., nitrogen) and may use a processing chamber with no sensor for detecting a condition (e.g., reaction condition) in the chamber. Further, there may be a significant length of piping (e.g., five (5) meters or more) between the point of adding the carrier gas and the processing chamber. An undetected carrier gas leak may occur over that distance so that the amount of carrier gas entering the processing chamber cannot be accurately determined based solely upon the measured amount of carrier gas added to the piping. Consequently, such methods may fail to provide for an accurate and stable HMDS reaction concentration in the wafer priming chamber. As a result, peeling of a photoresist layer that is applied to the device surface after the priming of the wafer may occur.

In a process of priming the wafer, the HMDS may react with silicon hydroxide (SiOH) and water according to the following reactions:

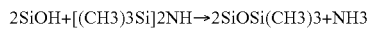

2SiOH+[(CH3)3Si]2NH→2SiOSi(CH3)3+NH3

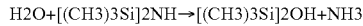

H2O+[(CH3)3Si]2NH→[(CH3)3Si]2OH+NH3

In one embodiment of the present invention, an entrance side sensor may be provided at an entrance of the wafer priming chamber to detect an amount of ammonia (NH3) in the flow/circulation of carrier gas/HMDS. The entrance side sensor may be used to perform an installation test on the carrier gas/HMDS, and determine a supply concentration of the primer supplied to the wafer priming chamber. An export side sensor measuring, for example, ammonia, nitrogen, oxygen, hydrogen, may be provided in the wafer priming chamber exhaust and used to define a chemical reaction effect (e.g., determine how much of the HMDS supplied to the chamber is reacted). The entrance side sensor and export side sensor may provide data to perform an instant change to flow of the carrier gas/HMDS, and a concentration of HMDS in the carrier gas/HMDS. That is, data from the entrance side sensor and export side sensor may be fed back (e.g., automatic feedback) into the system and used to determine a valve opening (e.g., opening a valve to increase a concentration of HMDS in the carrier gas/HMDS, and closing the valve to decrease a concentration of HMDS in the carrier gas/HMDS).

In particular, the entrance side sensor and export side sensor signals (e.g., machine signals) may be connected in series, so as to provide feedback to control and/or regulate the proper concentration of HMDS and proper flow rate in an automatic feedback system. Embodiment systems may determine the degree of the chemical reaction based on the feedback value provided by the entrance side sensor and export side sensor, and determine whether to strengthen (or weaken) the flow of HDMS introduced to the wafer priming chamber. By controlling the concentration and flow of HDMS, the system may be able to provide a stable reaction concentration of HMDS in the wafer priming chamber and thereby prevent peeling of a photoresist. In particular, the system may be able to provide the stable reaction concentration of HMDS in the wafer priming chamber even if there is an undetected carrier gas leak in the piping between the point of adding the carrier gas and the processing chamber.

FIG. 1 illustrates an apparatus 100 for processing a semiconductor device on a wafer according to one or more embodiments. The apparatus 100 includes a wafer priming chamber 110, and a plate 112 (e.g., heated plate) formed in the wafer priming chamber 110. A semiconductor wafer 113 to be processed (e.g., by applying a primer onto the semiconductor wafer 113, patterning a surface of the semiconductor wafer 113, etc.) may be positioned on the plate 112. The apparatus 100 may further include an exhaust line 115 for pulling a vacuum inside the wafer priming chamber 110, and exhausting an exhaust gas out of the wafer priming chamber 110.

The apparatus 100 may also include a first carrier gas line 120 for transporting a carrier gas (e.g., nitrogen, argon, etc.). The first carrier gas line 120 may have formed therein a flow meter 122 (e.g., mass flow meter (MFM)) for measuring a flow rate of the carrier gas in the first carrier gas line 120, and a flow control device 124 (e.g., flow control valve) for controlling (e.g., increasing and decreasing) the flow rate of the carrier gas in the first carrier gas line 120.

The apparatus 100 may also include a second carrier gas line 120a that may be formed off of the first carrier gas line 120. The second carrier gas line 120a may have formed therein a flow meter 122a (e.g., mass flow meter (MFM)) for measuring a flow rate of the carrier gas in the second carrier gas line 120a, and a flow control device 124a for controlling (e.g., increasing and decreasing) the flow rate of the carrier gas in the second carrier gas line 120a.

The apparatus 100 may also include a primer container 130 (e.g., bubbler) that contains liquid primer (e.g., liquid HMDS). The second carrier gas line 120a may be inserted into the primer container 130 so as to produce a primer vapor (e.g., primer/carrier gas) that is a gaseous mixture of the primer and the carrier gas. In particular, the carrier gas line 120a may have an opening formed in the liquid primer so as introduce the carrier gas into the liquid primer.

The apparatus 100 may also include a primer vapor line 140 for transporting the primer vapor out of the primer container 130. The primer vapor line 140 transporting the primer vapor may be combined with the first carrier gas line 120 transporting the carrier gas, and the combined primer vapor/carrier gas introduced as primer application gas to a primer application gas line 150 which transports the primer application gas (e.g., the combined carrier gas and primer vapor) into the chamber 110. The apparatus 100 may also include additional valves, pressure gauges, pressure relief valves, filters, pumps and sensors which are not shown in FIG. 1 for ease of explanation.

The apparatus 100 may be used, for example, to apply the primer which is contained in the primer container 130 onto a surface of the semiconductor wafer 113 in the chamber 110. In an embodiment, a method of applying the primer to the semiconductor wafer 113 may begin by positioning the semiconductor wafer 113 to be primed with primer (e.g., HMDS) into the wafer priming chamber 110 and closing the wafer priming chamber 110. The wafer priming chamber 110 may then be evacuated by pulling a vacuum in the wafer priming chamber 110 on the exhaust line 115. The vacuum may be pulled, for example, by using a vacuum pump, or by using a venturi connected to the exhaust line 115 and to a source of clean dry air.

A dehydration bake may then be performed within the wafer priming chamber 110. The dehydration bake may be performed for a time between about 3 to 7 seconds (e.g., about 5 seconds), although shorter or longer dehydration bake times may be used. The dehydration bake may be performed at a temperature within the wafer priming chamber 110 to be between about 115° C. to 125° C. (e.g., about 120° C.), although lower or higher temperatures may be used. The dehydration bake may be performed at a pressure within the wafer priming chamber 110 between about −12 to −17 inches of $H_2O$ (e.g., about −15 inches $H_2O$), although greater or lesser pressures may be used.

The flow control device 124 may be opened to allow the carrier gas to flow in the first carrier gas line 120. The flow control device 124a may also be opened to allow the carrier gas to flow in the second carrier gas line 120a and into the primer container 130 (e.g., bubbler). The carrier gas flow into the primer container 130 may cause the liquid primer contained within the primer container 130 to be vaporized into primer vapor. The primer vapor may be transported out of the primer container 130 by the primer vapor line 140 into the wafer priming chamber 110.

The primer vapor in primer vapor line 140 may be combined with carrier gas in the first carrier gas line 120 to form the primer application gas. The primer application gas may be transported through the primer application gas line 150 into the wafer priming chamber 110. The primer application gas may be applied to the surface of the semiconductor wafer 113 that has been positioned within the wafer priming chamber 110 for a dwell time of about 35 seconds to provide a sufficient level of adhesion of photoresist to the surface of the semiconductor wafer 113, although longer or shorter periods of dwell time may be used. The surface of the semiconductor wafer 113 may include a variety of materials that may comprise a semiconductor device that is formed on the semiconductor wafer 113. For example, the semiconductor device that is formed on the semiconductor wafer 113 may include a surface that comprises a semiconductor (e.g., silicon, germanium), silicon dioxide, aluminum oxide, silicon nitride, etc.

The primer vapor may be drawn from the primer container 130 through the primer vapor line 140 and primer application gas line 150 (e.g., as primer application gas) and into the wafer priming chamber 110 by the vacuum pump or exhaust venturi connected to the exhaust line 115. The primer application gas (which includes the primer vapor) may flow over the surface of the semiconductor wafer 113 and coat the semiconductor wafer 113 with an consistent layer of the primer.

During the priming of the semiconductor wafer 113, the interior of the wafer priming chamber 110 may be held at a pressure in the range of 740 torr and 780 torr (e.g., about 760 torr), and a temperature in a range from 117° C. to 123° C. (e.g., about 120° C.), although greater or lesser pressures and/or greater or lesser temperatures may be used. A flow rate of the primer application gas in the primer application gas line 150 may be, for example, in the range of about 3.5 to 4.5 liters per minute (e.g., about 4 liters per min), although greater or lower flow rates may be used.

After the priming of the surface of the semiconductor wafer 113 is complete, the primed semiconductor wafer 113 may be placed in a clean, laminar-flow, clean-air cool plate module (not shown) for about 60 seconds at about 19° C. The photoresist material may be applied to the primed surface of the semiconductor wafer 113 within about sixty minutes of the priming of the surface of the semiconductor wafer 113.

In one embodiment, the apparatus 100 may include a system 180 for controlling an amount (e.g., concentration) of primer in the primer application gas. As illustrated in FIG. 1, the system 180 may include a first sensor 181 for detecting a first content (e.g., ammonia (NH3)) in the primer application gas that may be introduced into the wafer priming chamber 110. The first sensor 181 may be formed in the primer application gas line 150 on an outer wall of the wafer priming chamber 110. The first sensor 181 may generate a first sensor signal (e.g., 4-20 mA signal) indicating a first content in the primer application gas (e.g., the amount of NH3 in the primer application gas). The first sensor 181 may include, for example, an infrared sensor, a chemisorption sensor, an electrochemical sensor or a solid-state charge-carrier-injection sensor. The first sensor 181 may be located at an entrance of the wafer priming chamber 110 and thus be configured as an entrance side sensor.

The system 180 may also include a second sensor 182 for detecting a second content (e.g., ammonia (NH3), nitrogen, oxygen and/or hydrogen) in the exhaust gas that may be exhausted from the wafer priming chamber 110 by the exhaust line 115. The second sensor 182 may be formed in the exhaust line 115 on an outer wall of the chamber 110, and may generate a second sensor signal (e.g., 4-20 mA signal) indicating the second content in the exhaust gas (e.g., the amount of ammonia, nitrogen, oxygen and/or hydrogen, in the exhaust gas). The second sensor 182 may include, for example, an infrared sensor, a chemisorption sensor, an electrochemical sensor or a solid-state charge-carrier-injection sensor. The second sensor 182 may be located at an exhaust or exit side of the wafer priming chamber 110 and thus be configured as an exhaust side sensor.

It should be noted that although the first sensor 181 and the second sensor 182 may be formed on an outer wall of the wafer priming chamber 110, the embodiments of the present inventions are not limited to this arrangement. That is, the first sensor 181 may be formed at another location so long as the first sensor 181 may accurately detect the first content in the primer application gas, and the second sensor 182 may be formed at another location so long as the second sensor 182 may accurately detect the second content in the exhaust gas.

The system 180 may also include the flow control device 124a that may be formed in the second carrier gas line 120a. The flow control device 124a may control the amount of primer in the primer application gas based at least in part on the first sensor signal from the first sensor 181 and the second sensor signal from the second sensor 182. That is, the flow control device 124a may use other signals or data to control the amount of primer in the primer application gas.

The system 180 may also include a sensor signal line 185 (e.g., wired sensor signal line) for transmitting the first sensor 181 signal and the second sensor 182 signal to the flow control device 124a. The sensor signal line 185 may include a first sensor signal line section 185a that transmits the first sensor signal from the first sensor 181, a second sensor signal line section 185b that transmits the second sensor signal from the second sensor 182, and a third sensor signal line section 185c which transmits the first sensor signal and second sensor signal (e.g., in series) to the flow control device 124a. Alternatively, the first sensor signal line section 185a and the second sensor signal line section 185b may each connect (e.g., directly connect) to the flow control device 124a, thereby eliminating the need for the third sensor signal line section 185c. In addition, each of the first sensor 181 and second sensor 182 may be wirelessly connected to the flow control device 124a by a wireless technology such as Bluetooth®, Zigbee® or other near-field communication technology. That is, each of the first sensor signal and the second sensor signal may be wireless signals which may eliminate the need for a wired connection 185 between the flow control device 124a, the first sensor 181, and the second sensor 182.

As noted above, the flow control device 124a may be formed in the second carrier gas line 120a and control a flow rate of carrier gas in the second carrier gas line 120a. The amount of primer vapor output from the primer container 130 into the primer vapor line 140 may depend on the flow rate of carrier gas in the second carrier gas line 120a. Therefore, the amount of primer vapor in the primer application gas may depend on the flow rate of carrier gas in the second carrier gas line 120a. Thus, the amount (e.g., concentration) of primer in the primer application gas may also depend upon the flow rate of the carrier gas in the second carrier gas line 120a.

Therefore, the amount (e.g., concentration) of primer in the primer application gas may be controlled by using the flow control device 124a to control the flow rate of carrier gas in the second carrier gas line 120a. For example, the flow control device 124a may include a control valve formed in the second carrier gas line 120a and having a variable sized opening. The flow control device 124a may increase the size of the opening to increase the flow rate of the carrier gas, which in turn may increase the amount of primer in the primer application gas. Conversely, the flow control device 124a may decrease the size of the opening to decrease the flow of carrier gas and in turn decrease the amount of primer in the primer application gas that is ultimately flowed through primer vapor line 140 in to the wafer priming chamber 110.

Thus, the system 180 may include a feedback control loop in which a characteristic of the primer application gas detected by the first sensor 181 and a characteristic of the exhaust gas detected by the second sensor 182 may be fed back to the flow control device 124a. Based on those characteristics, the flow control device 124a may cause the control valve to be opened or closed (e.g., automatically opened or closed without the need for any direct human interaction) to control the flow rate of carrier gas in the second carrier gas line 120a to a desired flow rate that produces a desired amount (e.g., concentration) of primer in the primer application gas. The desired amount of primer in the primer application gas may be defined, for example, as the amount of primer needed to maintain a stable concentration of primer in the wafer priming chamber 110 during the applying of the primer (e.g., the primer in the primer application gas) to the semiconductor wafer 113 that is positioned within the wafer priming chamber 110.

Figure 2:
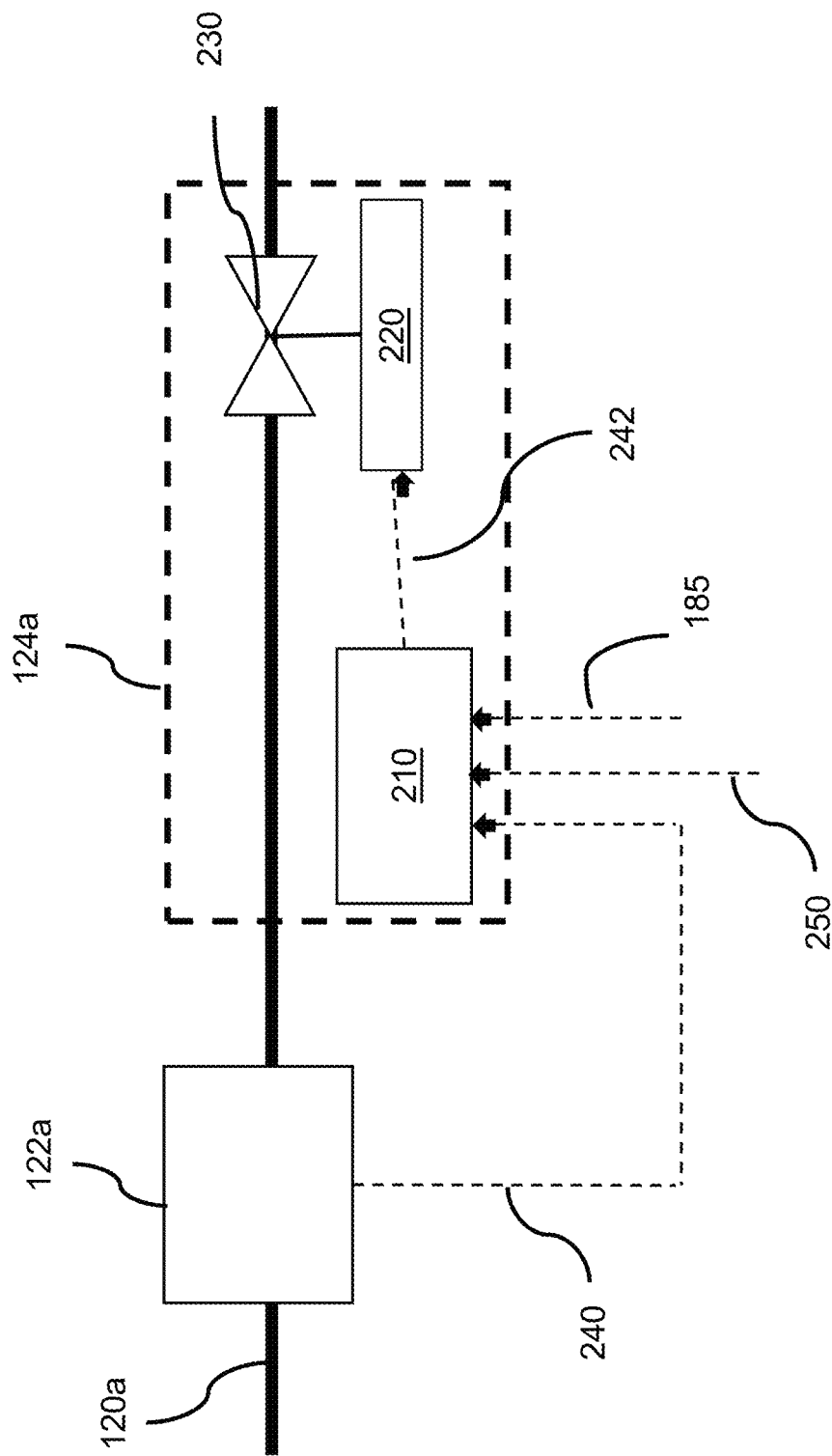
FIG. 2 illustrates a flow control device 124a that may be used in accordance with various embodiments.

FIG. 2 illustrates a flow control device 124a that may be used in some embodiments. As illustrated in FIG. 2, the flow control device 124a may include a flow controller 210, a valve positioner 220 that may be controlled by the flow controller 210, and a control valve 230 that may be positioned by the valve positioner 220.

In particular, the flow controller 210 may be connected to the sensor signal line 185 (or wireless connected to the first sensor 181 and second sensor 182) by which the flow controller 210 receives the first sensor signal and second sensor signal (e.g., a combined sensor signal including the first sensor signal and the second sensor signal). The flow controller 210 may also be connected to a carrier gas flow rate signal line 240 by which the flow controller 210 receives a carrier gas flow rate signal (e.g., 4-20 mA signal) from the flow meter 122a. The carrier gas flow rate signal indicates a flow rate of the carrier gas in the second carrier gas line 120a.

The flow controller 210 may also be connected to an operator control signal line 250 by which the flow controller 210 receives an operator control signal from an operator console (e.g., computer terminal). The operator control signal may include, for example, a digital signal transmitted by an operator console for adjusting an operating condition (e.g., flow rate set point) in the flow controller 210.

The flow controller 210 may generate a valve position signal (e.g., 4-20 mA signal) based on the first sensor signal, second sensor signal, and carrier gas flow rate signal, and transmit the valve position signal to the valve positioner 220 (e.g., piezo actuated valve positioner, air actuated valve positioner) by way of the valve position signal line 242. The valve positioner 220 may position (e.g., adjust) the control valve 230 according to valve position signal.

The control valve 230 may include, for example, a ball valve, butterfly valve, screw valve, etc. The control valve 230 may be formed in the second carrier gas line 120a and have a variable sized opening. The valve positioner 220 may "position" the control valve 230 so as to vary a size of the variable sized opening. That is, based on the valve position signal, the valve positioner 220 may increase the size of the opening in the control valve 230 to increase the flow of carrier gas that flows in second carrier gas line 120a through to primer container 130 and ultimately increase the amount of primer in the primer application gas that flows through primer vapor line 140 and into the wafer priming chamber 110. Conversely, based on the valve position signal, the valve positioner 220 may decrease the size of the opening in the control valve 230 to decrease the flow of carrier gas that flows in second carrier gas line 120a through to primer container 130 and ultimately decrease the amount of primer in the primer application gas that flows through primer vapor line 140 and into the wafer priming chamber 110.

Figure 3:
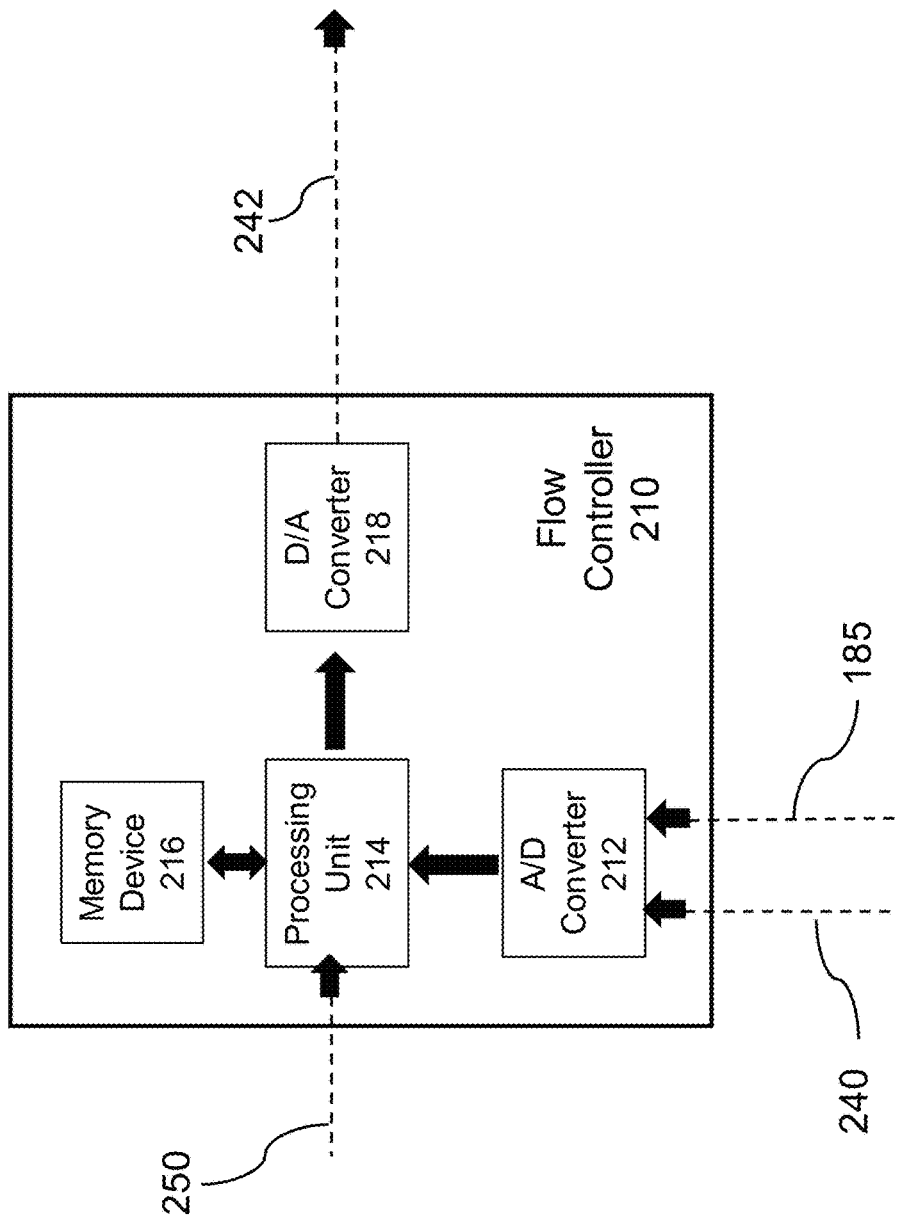
FIG. 3 illustrates a flow controller 210 that may be utilized in the apparatus 100 in some embodiments.

FIG. 3 illustrates a flow controller 210 that may be utilized in the apparatus 100 in some embodiments. As illustrated in FIG. 3, the flow controller 210 may include an A/D converter 212 which may be connected to the sensor signal line 185 by which the A/D converter 212 receives the first sensor signal and second sensor signal (e.g., a combined sensor signal including the first sensor signal and the second sensor signal). The A/D converter 212 may also be connected to a carrier gas flow rate signal line 240 by which the A/D converter 212 receives a carrier gas flow rate signal (e.g., 4-20 mA signal) from the flow meter 122a.

The flow controller 210 may also include a processing unit 214 (e.g., central processing unit (CPU) and a memory device 216 (e.g., random access memory (RAM)) which may store instructions to be executed by the processing unit 214, data (e.g., look up tables) to be used by the processing unit 214 in executing instructions, and other data (e.g., history data) that may include data generated by the processing unit 214. The processing unit 214 may also be connected to the operator control signal line 250 by which the processing unit 214 receives the operator control signal to adjust an operating condition (e.g., flow rate set point) in the flow controller 210.

The flow controller 210 may also include a D/A converter 218 which converts a valve control signal (e.g., digital valve control signal) from the processing unit 214 and outputs the valve control signal (e.g., an analog 4-20 mA signal) on the valve control signal line 242 that is coupled to valve positioner 220.

Figure 4:
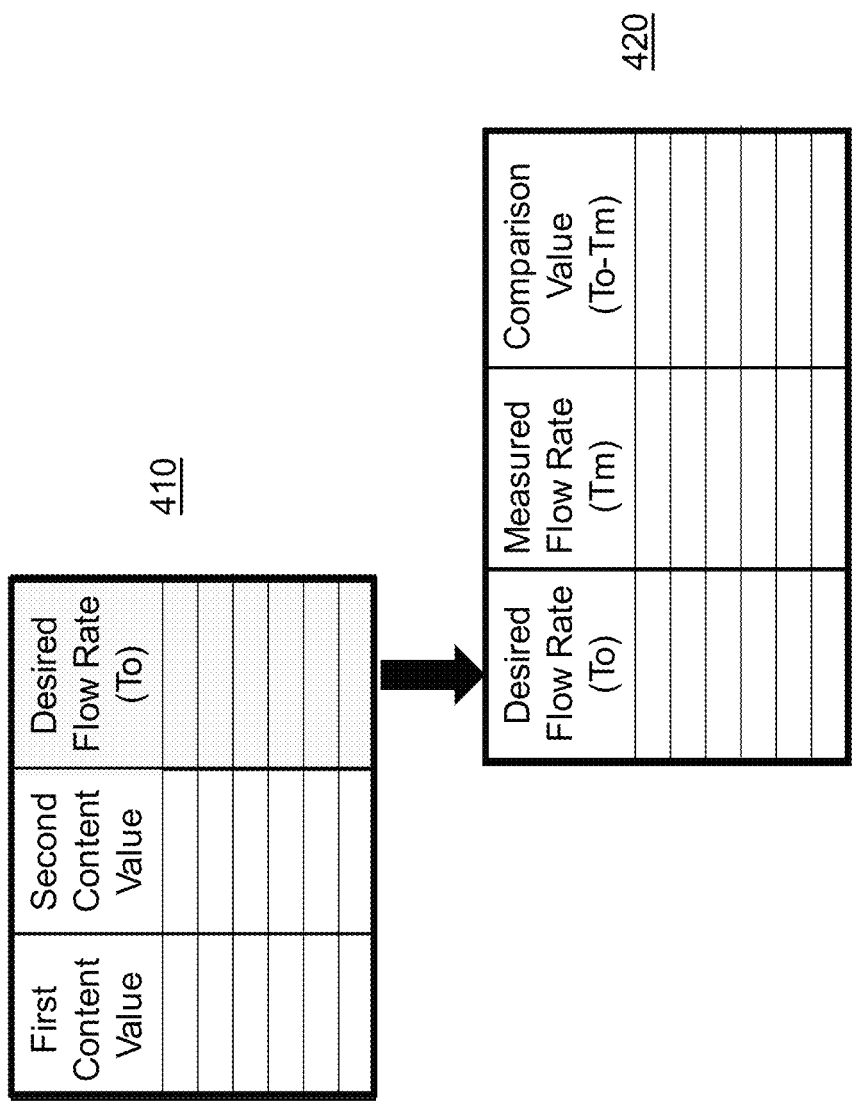
FIG. 4 illustrates a lookup table 410 and a calculation table 420 that may be stored in the memory device 216 of the flow controller 210.

FIG. 4 illustrates a lookup table 410 and a calculation table 420 that may be stored in the memory device 216 of the flow controller 210. These tables 410, 420 may be accessed, for example, by the processing unit 214 and used by the processing unit 214 to generate the valve control signal 242.

Table 410 is a lookup table that provides a desired flow rate (To) for a given first content value (e.g., first sensor 181 signal) and a given second content value (e.g., second sensor 182 signal). Alternatively, the Table 410 may include a desired flow rate (To) for a given combination of the first content value and the second content value. The desired flow rate is the flow rate that may have been determined (e.g., by experimentation) to provide the desired amount (e.g., concentration) of primer in the primer application gas in order to provide good adhesion between the photoresist layer and the surface of the semiconductor wafer 113. In some embodiments, the desired amount of primer in the primer application gas may be determined (e.g., by experimentation) to be the least amount of primer that is needed to provide good adhesion of the photoresist layer. In some embodiments, the desired amount of primer in the primer application gas may be determined (e.g., by experimentation) to be the amount of primer that is sufficient to provide good adhesion and without leaving any excess (e.g., unreacted) primer (e.g., in the exhaust gas, in the wafer priming chamber 110, etc.). The processing unit 214 may use the Table 410 to determine the desired flow rate (To) based on the first content value indicated by the first sensor signal and based on the second content value indicated by the second sensor signal.

Table 410 may be generated, for example, by conducting a series of experiments in which wafer priming is performed followed by photoresist layer application, while recording data that may include first content value, second content value, measured flow rate, amount of primer remaining (e.g., in the exhaust gas, in the wafer priming chamber 110, etc.) after priming and adhesion quality of the photoresist layer. For those experiments resulting in an acceptable (e.g., low) amount of primer remaining after priming and acceptable (e.g., good) adhesion of the photoresist layer, the amount of primer in the primer application gas may be determined to be a desired amount, and the measured flow rate may, therefore, be established as a Desired Flow Rate (To) for the corresponding first content value and second content value in Table 410. Other values for Desired Flow Rate (To) in Table 410 may be determined, for example, by interpolation or extrapolation based on the experimentally determined values for Desired Flow Rate (To).

As an example of how the flow control device 124a may determine a desired flow rate of the carrier gas in the carrier gas line based on the first sensor signal and the second sensor signal, assume that it is determined by experimentation that for a first content value of 50 ppm and a second content value of 100 ppm, the desired flow rate of carrier gas is 1 liter/second. These values may be included as one entry among the many entries in Table 410 which is stored in the memory device 216. Later, during the wafer priming, the first sensor 181 detects a first content value of 50 ppm of ammonia and the second sensor 182 detects a second content value of 100 ppm of ammonia. These values are transmitted as the first sensor signal and second sensor signal, by way of the sensor signal line 185 to the flow controller 210. The processing unit 214 of the flow controller 210 then accesses Table 410 in the memory device 216 to look up the Desired Flow Rate (To) for a first content value of 50 ppm and a second content value of 100 ppm, and finds the one entry indicating that the Desired Flow Rate (To) is 1 liter/second. Therefore, in this example, by referring to Table 410, the flow control device 124a will determine that the Desired Flow Rate (To) is 1 liter/second based on the first sensor signal and the second sensor signal.

Table 420 is a calculation table that includes a comparison value that may be calculated by the processing unit 214. The comparison value may be calculated by comparing the desired flow rate (To) obtained from Table 410 to the measured flow rate (Tm) indicated by the carrier gas flow rate signal. The processing unit 214 may use the calculated comparison value (To−Tm) to generate the valve control signal to be transmitted to the valve positioner 220 on the valve control signal line 242. For example, if the calculated comparison value (To−Tm) has a positive value, the processing unit 214 may generate a positive valve control signal indicating that the valve positioner 220 should increase the opening of the valve 230 by a predetermined amount. Conversely, if the calculated comparison value (To−Tm) has a negative value, the processing unit 214 may generate a negative valve control signal indicating that the valve positioner 220 should decrease the opening of the valve 230 by a predetermined amount.

It should be noted that the embodiments are not limited to the use of Tables 410, 420 in FIG. 4. That is, other suitable methods for the processing unit 214 to determine the valve control signal are within the contemplated scope of disclosure. For example, the processing unit 214 may combine the first sensor signal and the second sensor signal to generate a reaction degree value that indicates a degree of reaction of primer in the wafer priming chamber 110 (e.g., a degree of reaction of the primer with water in the wafer priming chamber 110 and a degree of reaction of the primer with silicon hydroxide (SiOH) in the wafer priming chamber 110).

The processing unit 214 may then compare the reaction degree value to a reference value (e.g., stored in memory device 216). In response to determining that the reaction degree value is less than the reference value, the processing unit 214 may generate a positive valve control signal to increase the opening of the valve 230 to increase the flow rate of carrier gas in the carrier gas line 120a. This may ultimately increase the concentration of the primer in the primer application gas. Conversely, in response to determining that the reaction degree value is greater than the reference value, the processing unit 214 may generate a negative valve control signal to decrease the opening of the valve 230 to decrease the flow rate of carrier gas in the carrier gas line 120a. This may ultimately decrease the concentration of the primer in the primer application gas.

Figure 5:
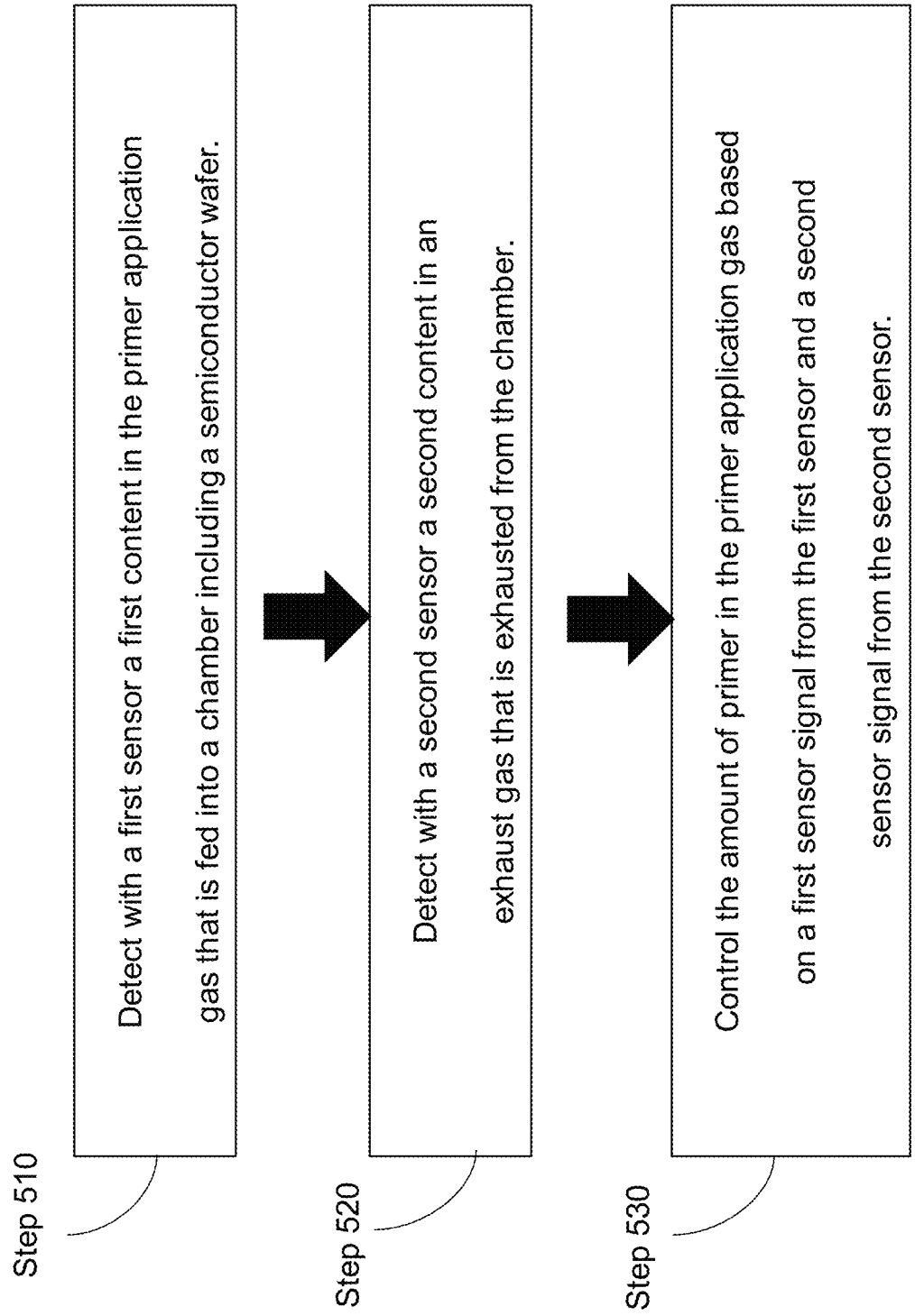
FIG. 5 is a flowchart illustrating the operations of a method of controlling an amount of primer in a primer application gas in accordance with various embodiments.

FIG. 5 illustrates a method of controlling an amount of primer in a primer application gas, according to some embodiments. The method includes Step 510, which is the step of detecting with a first sensor 181 a first content in the primer application gas that may flow into a wafer priming chamber 110 at the entrance to the wafer priming chamber 110. The wafer priming chamber 110 may have a semiconductor wafer 113 awaiting a primer positioned therein. The method may also include Step 520, which includes a step of detecting with a second sensor 182 a second content in an exhaust gas that is exhausted from the wafer priming chamber 110. The method may also include Step 530, which includes the step of controlling the amount of primer in the primer application gas based on a first sensor signal from the first sensor 181 and a second sensor signal from the second sensor 182.

In some embodiments, a system 180 for controlling an amount of primer in a primer application gas includes a first sensor 181 for detecting a first content in the primer application gas that is fed into a wafer priming chamber 110, wherein the wafer priming chamber 110 is configured to receive a semiconductor wafer 113, a second sensor 182 for detecting a second content in an exhaust gas that is exhausted from the wafer priming chamber 110, and a flow control device 124a that controls the amount of primer in the primer application gas based on a first sensor signal from the first sensor 181 and a second sensor signal from the second sensor 182. The first content may include an amount of ammonia (NH3) in the primer application gas, and the second content may include an amount of at least one of ammonia (NH3), nitrogen, oxygen and hydrogen in the exhaust gas. The primer application gas may include hexamethyldisilizane (HMDS) as the primer and nitrogen as a carrier gas. The flow control device 124a may include a control valve 230 that is formed in a carrier gas line 120a that supplies the carrier gas to a primer container 130 that contains the primer. The flow control device 124a may control the amount of primer in the primer application gas by controlling a flow rate of the carrier gas in the carrier gas line 120a. The flow control device 124a may provide a desired flow rate of the carrier gas in the carrier gas line 120a based on look-up table values for the first sensor signal and the second sensor signal. The flow control device 124a may adjust a size of an opening in the control valve 230 according to the desired flow rate of the carrier gas in the carrier gas line 120a. Each of the first sensor 181 and the second sensor 182 may include one of an infrared sensor, a chemisorption sensor, an electrochemical sensor and a solid-state charge-carrier-injection sensor. The system 180 may further include a sensor signal line 185 for transmitting the first sensor signal and the second sensor signal to the flow control device 124a. Each of the first sensor signal and the second sensor signal may include a wireless signal. The system 180 may include a feedback control loop system that maintains a stable concentration of primer in the wafer priming chamber 110 during the applying of the primer to the semiconductor wafer 113.

In some embodiments, a method of controlling an amount of primer in a primer application gas, may include detecting with a first sensor 181 a first content in the primer application gas that is fed into a wafer priming chamber 110 containing a semiconductor wafer 113, detecting with a second sensor 182 a second content in an exhaust gas that is exhausted from the wafer priming chamber 110, and controlling the amount of primer in the primer application gas based on a first sensor signal from the first sensor 181 and a second sensor signal from the second sensor 181. The first content may include an amount of ammonia (NH3) in the primer application gas, and the second content may include an amount of at least one of ammonia (NH3), nitrogen, oxygen and hydrogen in the exhaust gas. The primer application gas may include hexamethyldisilizane (HMDS) as the primer and nitrogen as a carrier gas. The controlling of the amount of primer in the primer application gas may include controlling a flow rate of the carrier gas in a carrier gas line 120a that supplies the carrier gas to a primer container 130 that contains the primer. The controlling of the amount of primer in the primer application gas may include controlling a control valve 230 that is formed in the carrier gas line 120a. The controlling of the amount of primer in the primer application gas may include providing a desired flow rate of the carrier gas in the carrier gas line 120a based on look-up table values for the first sensor signal and the second sensor signal. The controlling of the amount of primer in the primer application gas may further include adjusting a size of an opening in the control valve 230 according to the desired flow rate of the carrier gas in the carrier gas line 120a.

In some embodiments, an apparatus 100 for processing a semiconductor wafer 113, may include a wafer priming chamber 110 configured to receive the semiconductor wafer 113, a primer application gas line 150 for supplying a primer application gas to the wafer priming chamber 110, an exhaust line 115 for exhausting an exhaust gas from the wafer priming chamber 110, and a system 180 for controlling an amount of primer in the primer application gas, the system 180 including a first sensor 181 for detecting a first content in the primer application gas, a second sensor 182 for detecting a second content in the exhaust gas, and a flow control device 124a that controls the amount of primer in the primer application gas based on a first sensor signal from the first sensor 181 and a second sensor signal from the second sensor 182. The flow control device 124a may include a control valve 230 that controls the amount of primer in the primer application gas by controlling a flow rate of carrier gas that is supplied to a primer container 130 that contains the primer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for controlling an amount of primer in a primer application gas, comprising:
    a first sensor for detecting a first content in the primer application gas that is fed into a wafer priming chamber, wherein the primer is applied to a semiconductor wafer in the wafer priming chamber;
    a second sensor for detecting a second content in an exhaust gas that is exhausted from the wafer priming chamber; and
    a flow control device that determines an extent of reaction of the primer in the wafer priming chamber based on a first sensor signal from the first sensor and a second sensor signal from the second sensor, and controls the amount of primer in the primer application gas based on the extent of reaction so as to maintain a stable concentration of primer in the wafer priming chamber.

2. The system of claim 1, wherein the first content comprises an amount of ammonia ($NH_3$) in the primer application gas, and the second content comprises an amount of at least one of ammonia ($NH_3$), nitrogen, oxygen or hydrogen in the exhaust gas.

3. The system of claim 1, wherein the primer in the primer application gas comprises hexamethyldisilizane (HMDS) and a carrier gas in the primer application gas comprises nitrogen.

4. The system of claim 3, wherein the flow control device comprises a control valve that is positioned in a carrier gas line that supplies the carrier gas to a primer container that contains the primer.

5. The system of claim 4, wherein the flow control device controls the amount of primer in the primer application gas by controlling a flow rate of the carrier gas in the carrier gas line.

6. The system of claim 5, wherein the flow control device provides a desired flow rate of the carrier gas in the carrier gas line based on look-up table values for the first sensor signal and the second sensor signal.

7. The system of claim 6, wherein the flow control device adjusts a size of an opening in the control valve according to the desired flow rate of the carrier gas in the carrier gas line.

8. The system of claim 1, wherein each of the first sensor and the second sensor comprise one of an infrared sensor, a chemisorption sensor, an electrochemical sensor or a solid-state charge-carrier-injection sensor.

9. The system of claim 1, further comprising:
a first sensor signal line for transmitting the first sensor signal to the flow control device; and
a second sensor signal line for transmitting the second sensor signal to the flow control device.

10. The system of claim 1, wherein each of the first sensor signal and the second sensor signal comprises a wireless signal.

11. The system of claim 1, further comprising a feedback control loop system that maintains the stable concentration of primer in the wafer priming chamber.

12. A system for controlling an amount of primer in a primer application gas, comprising:
a first sensor for detecting an amount of a first component in the primer application gas that is fed into a chamber;
a second sensor for detecting an amount of a second component in an exhaust gas that is exhausted from the chamber; and
a flow control device that determines a degree of reaction of the primer in the chamber based on a first sensor signal from the first sensor and a second sensor signal from the second sensor, and controls the amount of primer in the primer application gas based on the degree of reaction so as to maintain a stable concentration of primer in the chamber.

13. The system of claim 12, wherein the first component comprises ammonia, and the second component comprises at least one of ammonia ($NH_3$), nitrogen, oxygen or hydrogen.

14. The system of claim 12, wherein the primer primes a surface to improve adhesion primer of a photoresist on the surface.

15. The system of claim 14, wherein the flow control device comprises:
a control valve located in a carrier gas line that supplies a carrier gas to a primer container that contains the primer; and
a flow controller configured to control the control valve so that a carrier gas flow rate of the carrier gas is set to a desired flow rate which produces a desired amount of the primer in the primer application gas.

16. The system of claim 15, wherein the flow controller comprises:
a memory device configured to store desired flow rate data; and
a processing unit configured to access the memory device and set the carrier gas flow rate to the desired flow rate based on the desired flow rate data.

17. The system of claim 16, wherein the flow controller adjusts a size of an opening in the control valve according to the desired flow rate of the carrier gas.

18. A system for controlling an amount of a primer in a primer application gas in an application gas line, comprising:
a first sensor in the application gas line for detecting an amount of a first component in the primer application gas, wherein the application gas line feeds the primer application gas into a chamber;
a second sensor for detecting an amount of a second component in an exhaust gas that is exhausted from the chamber; and
a flow control device configured to determine a degree of reaction of the primer in the chamber based on a first sensor signal from the first sensor and a second sensor signal from the second sensor and control a carrier gas flow rate of a carrier gas that carries the primer to the application gas line based on the degree of reaction so as to maintain a stable concentration of primer in the chamber.

19. The system of claim 18, wherein the flow control device comprises:
a control valve located in a carrier gas line that supplies the carrier gas to a container that contains the primer as a liquid, wherein the primer is carried as a vapor by the carrier gas from the container to the application gas line.

20. The system of claim 19, wherein the flow control device is configured to control the control valve so that the carrier gas flow rate is set to a desired flow rate which produces a desired amount of the primer in the primer application gas.

* * * * *